United States Patent [19]
Premerlani et al.

[11] Patent Number: 6,141,196
[45] Date of Patent: Oct. 31, 2000

[54] METHOD AND APPARATUS FOR COMPENSATION OF PHASOR ESTIMATIONS

[75] Inventors: William James Premerlani, Scotia, N.Y.; David Jeremiah Hoeweler, Encino, Calif.; Albert Andreas Maria Esser, Niskayuna, N.Y.; James Patrick Lyons, Niskayuna, N.Y.; Gerald Burt Kliman, Niskayuna, N.Y.; Rudolph Alfred Albert Koegl, Niskayuna, N.Y.; Mark Gerald Adamiak, Paoli, Pa.

[73] Assignee: General Electric Company, Schenectady, N.Y.

[21] Appl. No.: 09/032,948

[22] Filed: Mar. 2, 1998

[51] Int. Cl.$^7$ ....................................................... H02H 3/00
[52] U.S. Cl. ........................... 361/78; 361/93.1; 361/115; 361/62
[58] Field of Search ................................ 361/18, 115, 62, 361/64, 66, 78, 93.1, 85, 79, 88, 76

[56] References Cited

U.S. PATENT DOCUMENTS

| | | | |
|---|---|---|---|
| 4,715,000 | 12/1987 | Premerlani | 364/484 |
| 4,723,216 | 2/1988 | Premerlani | 364/484 |
| 5,514,978 | 5/1996 | Koegl et al. | 324/772 |
| 5,786,708 | 7/1998 | Premerlani et al. | 324/772 |
| 5,809,045 | 9/1998 | Adamiak et al. | 371/48 |

FOREIGN PATENT DOCUMENTS

| | | | |
|---|---|---|---|
| WO961296 | 5/1996 | WIPO | G01R 25/00 |

OTHER PUBLICATIONS

"A New Frequency Tracking and Phasor Estimation Algorithm for Generator Protection" by D. Hart, et al, IEEE Trans on Power Delivery, vol. 12, No. 3, pp. 1064–1073, Jul. 1997.

"Synchronized Phasor Measurements in Power Systems" by AG Phadke, IEEE Computer Applications in Power, Apr. 1993, pp. 10–15.

"Probability and Random Processes for Electrical Engineering" by A. Leon–Garcia, Analysis & Processing of Random Signals, Chap. 7, 1994, pp. 426–438.

"Computer Relaying for Power Systems" by AG Phadke, et al, 1988, pp. 146–158.

U.S. application No. 08/713,295, Mark G. Adamiak, et al, filed Sep. 13, 1996, "Digital Current Differential System" Atty Docket RD–24,982.

U.S. application No. 08/617718, by WJ Premerlani, et al, filed Apr. 1, 1996, "Self–Tuning and Compensating Turn Fault Detector" Atty Docket No. RD–24,585.

*Primary Examiner*—Stephen W. Jackson
*Attorney, Agent, or Firm*—Ann M. Agosti; Jill M. Breedlove

[57] ABSTRACT

A method for obtaining a power system phasor includes sampling a power system signal at instants determined by a nominal power system frequency to provide a plurality of data samples; using the data samples to estimate a phasor having an elliptical trajectory; generating a deviation formula representing a frequency deviation between actual and nominal power system frequencies; and using the deviation formula to perform a coordinate transform of the estimated phasor to provide a scaled phasor having a substantially circular trajectory. If the data samples are unevenly spaced, a method in another embodiment includes minimizing squares of errors between the unevenly spaced data samples and an approximating sinusoidal function of the data samples. Power system phasors can be used to detect turn faults by providing scaled current and voltage phasors; extracting fundamental voltage and current phasors; and applying a symmetrical component transform to the fundamental voltage and current phasors to obtain symmetrical component voltage and current phasors for use in determining the existence of a turn fault. Variance calculations and/or trigonometric function fits can be used to increase sensitivity of fault detection.

23 Claims, 4 Drawing Sheets

METHOD AND APPARATUS FOR COMPENSATION OF PHASOR ESTIMATIONS

BACKGROUND OF THE INVENTION

In conventional techniques for using digitized data samples to determine fundamental power system frequency phasors, a small time-varying error is produced by mismatch between the actual power system frequency and the nominal power system frequency (the sampling frequency divided by the number of samples per cycle). In situations wherein high accuracy is not needed, the error is typically not corrected. However, the error does interfere with sensitive measurements and calculations of negative sequence quantities and differential quantities, for example.

Estimating power system voltages and currents when data windows are uneven due to slowly varying frequency, slowly varying spacing of data points, or variable size can be especially challenging. Conventional methods for calculating power system voltage and current phasors generally assume that data samples are substantially evenly spaced in time and do not include efficient techniques for estimating noise and measurement uncertainty. Although assumptions about even spacing are adequate for many applications, some applications have data points that are not evenly spaced. For example, a motor driven by an electronic control has a power frequency which can vary rapidly. Some controls use a concept referred to as "space vector control" in which the phase angles of applied voltages are controlled directly and may change rapidly in a non-uniform sequence of phase angles. In these controls, raw data points used to estimate fundamental voltage and current phasors are, in effect, spaced unevenly over the sinusoidal function on which they are based.

Phadke et al., *Computer Relaying for Power Systems*, Research Studies Press, 1988, describes a noise and uncertainty estimator, referred to as a transient monitor, which uses the sum of the absolute values of the errors and requires a number of multiplication steps which is proportional to the square of the number of samples in the data window.

Commonly assigned Koegl et al., U.S. Pat. No. 5,514,978, describes a method for detecting stator turn faults that is particularly useful in AC motors energized directly from power lines. The method of Koegl et al. is based on an assumption of approximately evenly spaced samples of voltage and current with only slight frequency variations and has limitations with respect to motors that are energized by variable frequency voltages or that experience rapid changes in power system frequency. In Koegl et al., U.S. Pat. No. 5,514,978, sensitive measurements of negative sequence current are used to detect stator turn to turn faults. Values are calculated using raw samples of voltages and current, phasors are corrected for slight variations in power system frequency, and positive and negative sequence currents are then calculated using the phasors.

As described in commonly assigned Premerlani et al, U.S. application Ser. No. 08/617,718, "Self Tuning and Compensating Turn Fault Detector," filed Apr. 1, 1996, sensitivity can be increased through an adaptive learning process to obtain the residual negative sequence current as a function of load and voltage. The fault current is obtained after all sources of negative sequence current are determined and subtracted from the measured negative sequence current. To correct phasors due to variations in motor excitation frequency, the drift in the power system frequency was measured and a corrective algorithm was applied. In the situation of a variable speed drive, if the applied frequency is changing rapidly, the corrective algorithm does not provide as much accuracy as would be desirable.

High speed detection of faults on multi-terminal power system transmission lines is needed in situations where data transmitted digitally between pairs of terminals in a system is partially lost. Commonly assigned Adamiak et al., U.S. application Ser. No. 08/713,295, "Digital Current Differential System," filed Sep. 13, 1996, describes a multi-terminal system wherein fundamental power system frequency voltages and currents are calculated from digitized samples of voltages and currents with a data window which can have variable sizes for use in digital devices that measure fundamental frequency voltage or current components. The "phaselet" technique partitions the calculation into two processes. The first process is a calculation of partial sums of the data samples multiplied by one cycle weights. The second process is a summation of the partial sums over the width of the desired data window and a correction for distortion caused by the one cycle weights. Occasional failures of the digital channel that result in lost information were addressed by resetting the computation window after data again became available. A slight delay in fault detection can occur in the event that some phaselet data is lost at the beginning of a fault.

SUMMARY OF THE INVENTION

It would be advantageous to provide a more efficient and accurate estimation of fundamental power system frequency phasors and variances from digital data samples even in circumstances of slight deviations in either the power system frequency or the sampling rate. It would additionally be advantageous to provide a real time method for estimating fundamental power system voltages and currents as well as noise and uncertainty from unevenly spaced or missing data samples. It would further be advantageous to estimate noise and uncertainty using the calculations based on squares of errors and including a number of multiplication steps proportional to the number of samples (instead of the square of the number of samples). These estimations would be useful in power system equipment diagnosis and protection algorithms for motor transformers, transmission lines, and generators, for example, and would be particularly useful in turn-fault diagnostics in induction motors experiencing conditions encountered with adjustable speed drives such as the presence of harmonics and rapidly changing frequency.

In the present invention, one embodiment of a method for obtaining a power system phasor includes: sampling a power system signal at instants determined by a nominal power system frequency to provide a plurality of data samples; using the plurality of data samples to estimate a phasor having an elliptical trajectory; generating a deviation formula representing a frequency deviation between actual and nominal power system frequencies; and using the deviation formula to perform a coordinate transform of the estimated phasor to provide a scaled phasor having a substantially circular trajectory. If the data samples are unevenly spaced, the method in another embodiment includes minimizing squares of errors between the unevenly spaced data samples and an approximating sinusoidal function of the data samples.

Power system phasors can be used to detect turn faults by providing scaled current and voltage phasors; extracting fundamental voltage and current phasors; and applying a symmetrical component transform to the fundamental voltage and current phasors to obtain symmetrical component voltage and current phasors for use in determining the existence of a turn fault. Variance calculations and/or trigonometric function fits can be used to increase sensitivity of fault detection.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF PREFERRED EMBODIMENTS OF THE INVENTION

Figure 1:
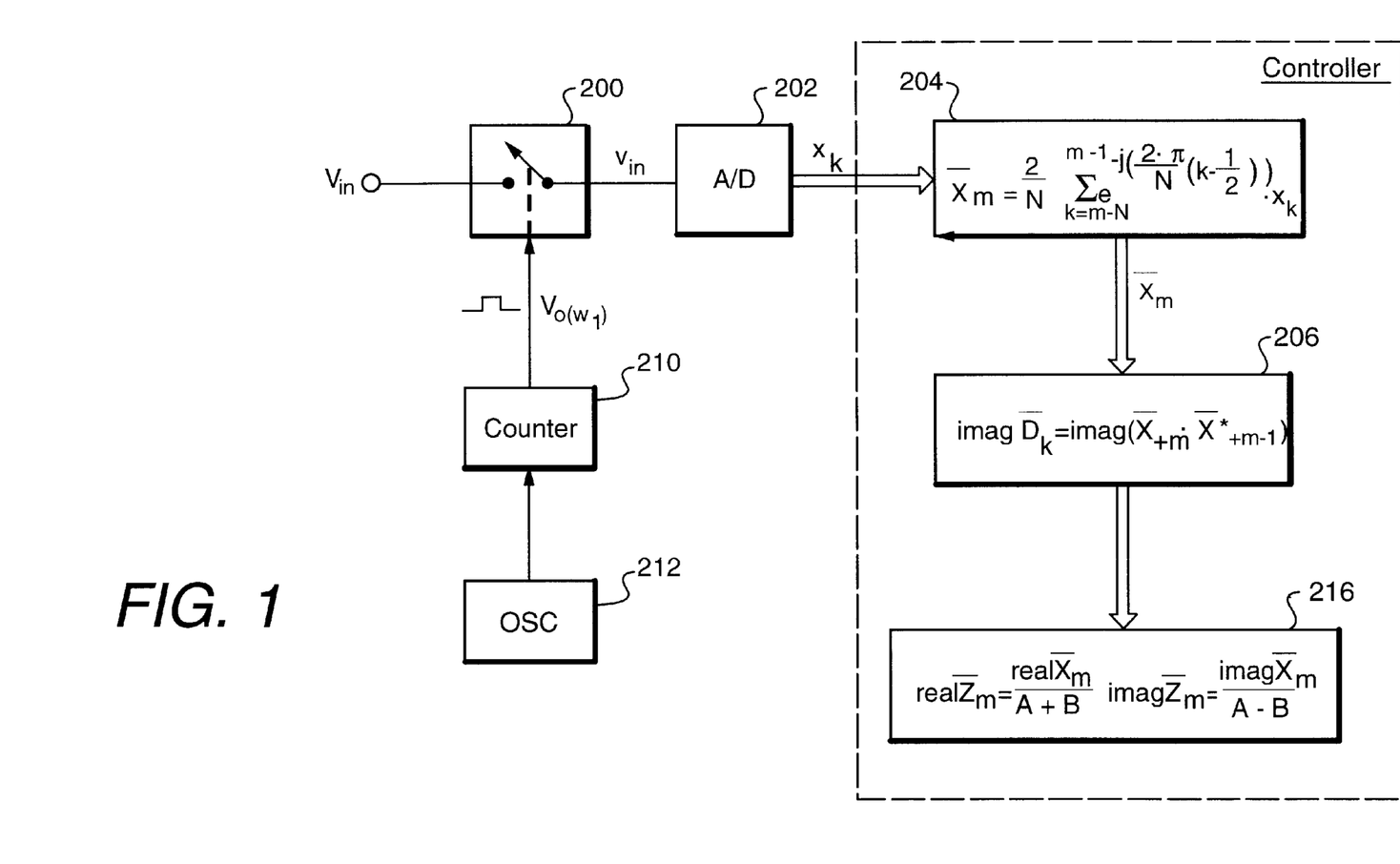
FIG. 1 is a block diagram illustrating one phasor estimation embodiment of the present invention.

FIG. 1 is a block diagram illustrating one embodiment of the present invention. A sampler 200 receives sinusoidal input $V_{in}$ and provides an analog voltage output $v_{in}$ at a sampling rate as determined by the sampling signal $V_0$. An A/D converter 202 is coupled for receiving the analog voltage output $v_{in}$ of sampler 200 and for converting this analog voltage signal to a digital data signal $x_k$ wherein the data represents the magnitude of the input voltage at the sampling instant. A counter 210 is used for counting pulses received from an oscillator 212 until a selected number of pulses have been received and, thereafter, providing a sampling pulse (sampling signal $V_0$) to sampler 200. The digital data signal $x_k$ is then transmitted to controller 208 for analysis. In one embodiment, controller 208 comprises a computer.

FREQUENCY DEVIATION COMPENSATION

When the actual power system frequency (from $V_{in}$) and the nominal power system frequency (from $V_0$) are not exactly matched, any phasors calculated from a fundamental component of a discrete Fourier transform (DFT) move in an elliptical trajectory in the complex plane. The eccentricity of the ellipse and the rate of motion depend on the deviation between the actual and nominal power system frequencies. For small deviations, the eccentricity of the ellipse is small, and the motion is gradual. Thus, phasors move approximately at a constant rate in a circle. For larger deviations, the eccentricity is larger, and the motion is more rapid. Although voltages have been discussed above, analysis of currents can be performed in an equivalent manner.

One method for calculating a phasor is to minimize the sum of the squares of the errors between sampled data values and a fitted sine function over one period of the fitted sine function. This method includes a Fourier transform element 204 using one component of a DFT as follows:

$$\overline{X}_m = \frac{2}{N} \sum_{k=m-N}^{m-1} e^{-j\left(\frac{2\pi}{N}\left(k-\frac{1}{2}\right)\right)} \cdot x_k, \qquad (1)$$

wherein $\overline{X}_m$ represents the phasor estimate of sample m, N represents the number of samples per cycle, and $x_k$ represents the kth sample of signal x taken at N samples per cycle. The use of a line over a capital letter indicates that the parameter has real and imaginary components.

This method can either be performed, as discussed above, for each sample m or can be performed for each cycle of N samples m. If the method is performed for each cycle, equation (1) becomes:

$$\overline{X}_m = \frac{2}{N} \sum_{k=m\cdot N-N+1}^{m\cdot N} e^{-j\left(\frac{2\pi}{N}\left(k-\frac{1}{2}\right)\right)} \cdot x_k. \qquad (1a)$$

Normally, the nominal power system frequency (which is the data sampling frequency divided by N) equals the actual power system frequency. Because the sampling frequency cannot be set exactly to the desired value, and because both the actual power system frequency and the nominal power system frequency can drift, error results. A more accurate calculation of a phasor $\overline{X}'_m$ is as follows:

$$\overline{X}'_m = A \cdot \overline{X} \cdot e^{j2m\cdot\frac{\pi}{N}\left(\frac{N\cdot f_p - f_s}{f_s}\right)} + B \cdot \overline{X}^* \cdot e^{-j2m\cdot\frac{\pi}{N}\left(\frac{N\cdot f_p - f_s}{f_s}\right)}, \qquad (2)$$

wherein $$A = \frac{\sin\left(\pi\cdot\left(\frac{f_p - f_s}{f_s}\right)\right)}{N\cdot\sin\left(\frac{\pi}{N}\cdot\left(\frac{f_p - f_s}{f_s}\right)\right)}, \qquad (3)$$

$$B = \frac{\sin\left(\pi\cdot\left(\frac{f_p - f_s}{f_s}\right)\right)}{N\cdot\sin\left(\frac{2\pi}{N} + \frac{\pi}{N}\cdot\left(\frac{f_p - f_s}{f_s}\right)\right)}, \qquad (4)$$

and wherein $f_p$ represents the actual power system frequency, $f_s$ represents the nominal power system frequency (the sampling frequency divided by the number of samples per cycle), and $\overline{X}$ represents the true phasor value (an unknown). Equation (2) is illustrative of the way in which error creeps into the phasor calculation by gain, phase shift, and bleed-through effects.

The deviation formula of the equations of (3) and (4) represented by $$\pi\cdot\left(\frac{f_p - f_s}{f_s}\right) \qquad (5)$$

can be calculated by observing the apparent rotational rate of phasors as disclosed in commonly assigned Premerlani, U.S. Pat. No. 4,715,000. Briefly, U.S. Pat. No. 4,715,000 describes steps of sampling an input signal at instants determined by a sampling signal to provide a plurality of data signals associated with one cycle of the input signal and adapting a signal processor to receive first and second pluralities of data signals associated with first and second cycles of the input signal and to perform two discrete Fourier analyses to provide two phasor signals representing two voltage phasors of respective fundamental frequencies of the discrete Fourier transforms. The phasor signals are used to generate a difference signal indicative of the angle between the two voltage phasors and, therefore, proportional to the difference between the nominal and actual power system frequencies.

In another embodiment, the deviation quantity can be calculated in a deviation quantity calculator 206 by multiplying the positive sequence voltage phasor $\overline{X}_{+m}$ for sample m by the complex conjugate of the positive sequence voltage phasor $\overline{X}^*_{+m-1}$ from the previous sample (the quantity can alternatively be calculated once per cycle, if desired). Because the phase angle of the deviation phasor depends on the frequency deviation, the frequency deviation ratio $\overline{D}_k$ can be recovered by the following equation:

$$\overline{D}_k = (\overline{X}_{+m} \cdot \overline{X}^*_{+m-1}) = \text{real}\overline{D}_k + j\text{imag}\overline{D}_k, \qquad (6)$$

wherein $\text{imag}\overline{D}_k$ represents an imaginary component of a deviation phasor, and $\text{real}\overline{D}_k$ represents a real component of the deviation phasor. Both these components can be used to determine the deviation formula as follows:

$$\pi \cdot \left( \frac{f_p - f_s}{f_s} \right) = \frac{a\tan\left( \frac{\text{imag}(\overline{D}_k)}{\text{real}(\overline{D}_k)} \right)}{2}. \qquad (7)$$

The estimated phasor $\overline{X}'_m$ equation describes an ellipse with the estimated phasor making one complete circuit through the ellipse with a frequency proportional to the mismatch between the actual power system frequency and the nominal power system frequency. The eccentricity of the ellipse grows as the mismatch grows and leads to error in the magnitude and phase angle of the estimated phasor.

The rotation of the phasor estimates is not a problem when all phasors rotate together and the relative angles remain approximately constant. Additionally, errors due to the eccentricity of the ellipse can be reduced by a coordinate transformation that converts the ellipse into a circle. When the actual power system frequency does not match the nominal sampling frequency, the rate of motion around the ellipse and the eccentricity of the ellipse grow as the frequency deviation increases. The phasor error can be compensated with a scaling operation having different multipliers for the real and imaginary components. Preferably the compensation is performed for all phasors using a filtered frequency deviation ratio.

The following formulas are used to obtain correction factors from the frequency deviation ratio:

$$\varepsilon_1 = \frac{\pi \cdot \left( \frac{f_p - f_s}{f_s} \right)}{N \cdot \sin \frac{2\pi}{N}}, \text{ and} \qquad (8)$$

$$\varepsilon_2 = \frac{\left( \pi \cdot \left( \frac{f_p - f_s}{f_s} \right) \right)^2}{6}. \qquad (9)$$

The first correction factor $\varepsilon_1$ is useful for all applications. The second correction factor $\varepsilon_2$ is more applicable when a frequency deviation on the order of about one percent or higher is expected. The correction factors can be applied in a scaling element 216 using the following equations:

$$\text{real}\overline{Z}_m = \text{real}\overline{X}_m \cdot (1 + \varepsilon_2 - \varepsilon_1) \approx \frac{\text{real}\overline{X}_m}{A + B} \qquad (10)$$

and $$\text{imag}\overline{Z}_m = \text{imag}\overline{X}_m \cdot (1 + \varepsilon_2 + \varepsilon_1) \approx \frac{\text{imag}\overline{X}_m}{A - B}, \qquad (11)$$

wherein $\overline{Z}_m$ represents a scaled phasor obtained when the real part of the estimated phasor is scaled by dividing A+B and the imaginary part of the estimated phasor is scaled by dividing A−B. The scaled phasor has correct magnitudes and correct and constant relative phase angles.

After the phasor is scaled, the scaled phasor can be used in applications such as turn-fault diagnostics and other power system equipment diagnosis and protection algorithms for motors, transformers, transmission lines, and generators, for example.

Several alternative variations exist for calculating phasors. In one embodiment, the ½ sample offset used above in estimating $\overline{X}_m$ is not applied. Equation (1) is modified as follows:

$$\overline{X}_m = \frac{2}{N} \sum_{k=m-N}^{m-1} e^{-j\left(\frac{2\pi}{N} \cdot (k)\right)} \cdot x_k. \qquad (12)$$

In this embodiment, the ellipse has axes that are rotated 180/N degrees with respect to the axes of the above discussed embodiment. For example, if N equals sixteen, a rotation of 11.25 degrees results. This rotation can be compensated for by rotating the real and imaginary portions of phasor $\overline{X}'_m$ by multiplying the portions by $e^{j\pi/N}$ prior to performing the coordinate transformation to convert the ellipse into a circle.

Variance calculations can be used to set thresholds in diagnostic applications such as turn fault detection, for example, for increasing sensitivity of the analysis. The variance $\sigma_m^2$ of a phase estimate of a fundamental power system frequency voltage or current measurement can be calculated as follows:

$$\langle \sigma_m^2 \rangle = \frac{1}{N} \cdot SumOfSquares_m - \qquad (13a)$$
$$\frac{1}{2} \cdot ((PhasorReal_m)^2 + (PhasorImaginary_m)^2),$$

wherein $PhasorReal_m$ represents the real portion of the scaled phasor, $PhasorImaginary_m$ represents the imaginary portion of the scaled phasor, and $SumOfSquares_m$ represents the sum of the squares of the data samples $x_k$ which can be expressed by the following calculation:

$$SumOfSquares_m = \left[ \sum_{k=m-N}^{m-1} x_k^2 \right]. \qquad (13b)$$

If frequency deviations greater than one percent are expected, the variance calculation discussed above can be replaced as follows. First, the scaled phasor components are rotated as follows:

$$\text{real}\overline{Z}_m^r = \text{real}\overline{Z}_m \cdot e^{j\frac{\pi}{N}} \qquad (14)$$

and $$\text{imag}\overline{Z}_m^r = \text{imag}\overline{Z}_m \cdot e^{j\frac{\pi}{N}}. \qquad (15)$$

wherein $\text{real}\overline{Z}_m^r$ and $\text{imag}\overline{Z}_m^r$ represent the rotated, scaled phasor components. Then, the variance can be calculated by the following equation:

$$\langle \sigma_m^2 \rangle = \frac{1}{N} \cdot SumOfSquares_m - \qquad (16)$$

$$\frac{1}{2}\left((\text{real}Z_m^r)^2 \cdot (1+2\cdot\varepsilon_1) + (\text{imag}Z_m^r)^2 \cdot (1-2\cdot\varepsilon_1)\right).$$

UNEVEN DATA WINDOW COMPENSATION

In another embodiment, data windows are uneven. That is, (1) data windows are not single full cycle data windows in that they occur over either a partial cycle or a cycle greater than one cycle or (2) data can be unevenly spaced as a result of obtaining unevenly spaced data samples in time or as a result of a rapidly changing frequency or (3) data can be partially missing.

In one such embodiment, the squares of errors are minimized between data samples and an approximating sinusoidal function. No assumption about the spacing of data points is made. The following equation relates to the estimation of a fundamental frequency power system quantity as a phasor $\hat{X}_p$ to its raw samples:

$$\begin{bmatrix} \hat{X}_C \\ \hat{X}_S \end{bmatrix} = \begin{bmatrix} \sum \cos\theta_k \cdot \cos\theta_k & \sum \cos\theta_k \cdot \sin\theta_k \\ \sum \cos\theta_k \cdot \sin\theta_k & \sum \sin\theta_k \cdot \sin\theta_k \end{bmatrix}^{-1} \cdot \begin{bmatrix} \sum x(\theta_k) \cdot \cos\theta_k \\ \sum x(\theta_k) \cdot \sin\theta_k \end{bmatrix}, \qquad (17)$$

$$\hat{X}_p = \hat{X}_c - j\hat{X}_s, \qquad (18)$$

wherein signal samples x are taken at arbitrary angles $\theta_k$, $\hat{X}_c$ represents the cosine trigonometric function (and thus the real portion) of the phasor estimate, $\hat{X}_s$ represents the negative sine trigonometric function (and thus the imaginary portion) of the phasor estimate, and the hats represent estimated parameters. The summation of the samples can be taken over any window of interest and can be performed efficiently using a recursive technique by adding or subtracting the data from samples entering or leaving the data window.

In another way of writing equation (17), the trigonometric identities can be used to express the sums in terms of double angles using the following equation:

$$\begin{bmatrix} \hat{X}_C \\ \hat{X}_S \end{bmatrix} = \qquad (19)$$

$$\begin{bmatrix} \sum \frac{1+\cos(2\cdot\theta_k)}{2} & \sum \frac{\sin(2\cdot\theta_k)}{2} \\ \sum \frac{\sin(2\cdot\theta_k)}{2} & \sum \frac{1-\cos(2\cdot\theta_k)}{2} \end{bmatrix}^{-1} \cdot \begin{bmatrix} \sum x(\theta_k) \cdot \cos\theta_k \\ \sum x(\theta_k) \cdot \sin\theta_k \end{bmatrix}$$

The sine and cosine trigonometric functions $\sin\theta_k$ and $\cos\theta_k$ can be evaluated at the sample angles by interpolation from a lookup table, for example. Variance estimations for phasor $\hat{X}_p$ can be calculated as described in equations 13a, 13b, and 14–16 above.

In another embodiment, phasors are estimated and scaled on a sliding window. The sliding window can be used for either stationary estimation methods or rotating estimation methods. A sliding window embodiment is useful for sharing data points in adjacent windows and determining new window data for each sample. The N samples in a given window are the previous number (N–1) of samples plus the new sample. Typically, a new mathematical analysis of the entire window is not required. Instead, the previous window data is used with an adjustment for the sample that is not included in the present window and an adjustment for the newest sample.

For a stationary estimation sliding window embodiment, DFT coefficients are assigned to data samples. The estimated phasor rotation is proportional to the mismatch frequency and is much slower. In this embodiment, the estimated phasors are rotated by the angle of the sliding window before performing the coordinate transformation and then the transformed phasor is rotated back.

For a rotating estimation sliding window embodiment, DFT coefficients are assigned to positions in the sliding window, and the above-discussed scaling process can be directly applied. In this embodiment, the estimated phasor rotates approximately once per cycle. For example, with a 16 sample method, the estimated phasor will have 16 different angles as the window slides over a full cycle. In power system applications, stationary equations are simpler to calculate and filter than rotating equations.

Any noise existing in the positive sequence voltage phasor that can affect the estimate of the frequency deviation ratio should be filtered. In one embodiment, for example, a simple software low pass filter with a time constant of ten seconds is used.

COMPENSATION FOR TURN FAULT DETECTION

Figure 2:
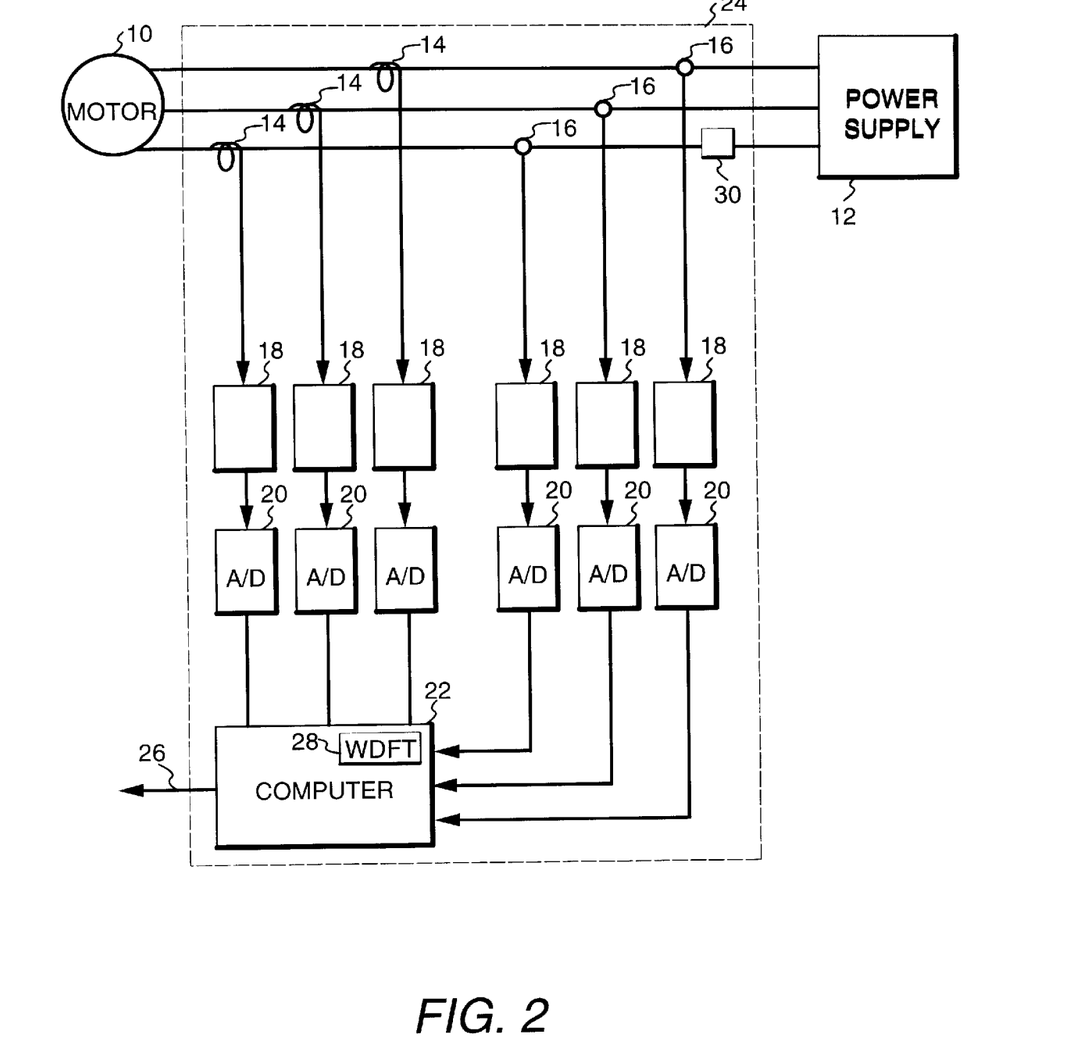
FIG. 2 is a block diagram.

FIG. 2 is a block diagram of a data acquisition system 24 for detecting turn faults in an induction motor 10 receiving power from a power supply 12, as disclosed in aforementioned Koegl et al., U.S. Pat. No. 5,514,978.

The present invention can be used to obtain more accurate phasor estimations of the negative sequence voltage V_ and the negative sequence current I_ which can then be used in the same manner as discussed in Koegl et al. Briefly, current sensors 14 measure motor current, and voltage sensors 16 measure motor voltage waveforms. Each measurement of a current or voltage is processed by a respective signal conditioner 18 which may include an amplifier and an anti-aliasing filter, for example. Each conditioned signal can be converted to a digital signal by either a common or separate respective analog-to-digital (A/D) converter 20. The voltages and currents that are measured can be processed in the computer by being separated into balanced but oppositely rotating sets according to the theory of symmetrical components.

A discrete Fourier transform (DFT) 28, which can be weighted if desired, is used in the computer to increase the accuracy and precision of the calculations. The DFT is applied to the digital signals and filters out high frequency signals and DC drifts and only passes fundamental frequency signals. The DFT is applied to calculate symmetrical component phasors by combining the symmetrical component transform into the discrete Fourier transform. This technique provides positive, negative, and zero sequence impedances.

By combining equations of the DFT and the symmetrical components, it is possible to compute a negative sequence quantity using a discrete Fourier transform directly from data samples:

$$X_-(m) = \frac{2}{N} \sum_{k=m-N}^{m-1} x_a(k\Delta t)e^{-j2k\frac{\pi}{N}} + \qquad (20)$$

$$\frac{2}{N} \sum_{k=m-N}^{m-1} x_b(k\Delta t)e^{-j\left(2k\frac{\pi}{N}+\frac{2\pi}{3}\right)} + \frac{2}{N} \sum_{k=m-N}^{m-1} x_c(k\Delta t)e^{-j\left(2k\frac{\pi}{N}+\frac{4\pi}{3}\right)}.$$

After the DFT is applied, equations 10 and 11 can be used to compensate for any frequency deviations and calculate $V_-$ and $I_-$. In another embodiment, equation 17 or 19 can be used to compensate for unevenly spaced sample collection as well as for frequency deviations.

In one embodiment, the negative sequence impedance $Z_-$ is obtained from dividing $V_-$ by $I_-$, and $Z_-$ is then compared with a threshold or nominal negative sequence impedance to determine whether a fault exists.

Figure 3:
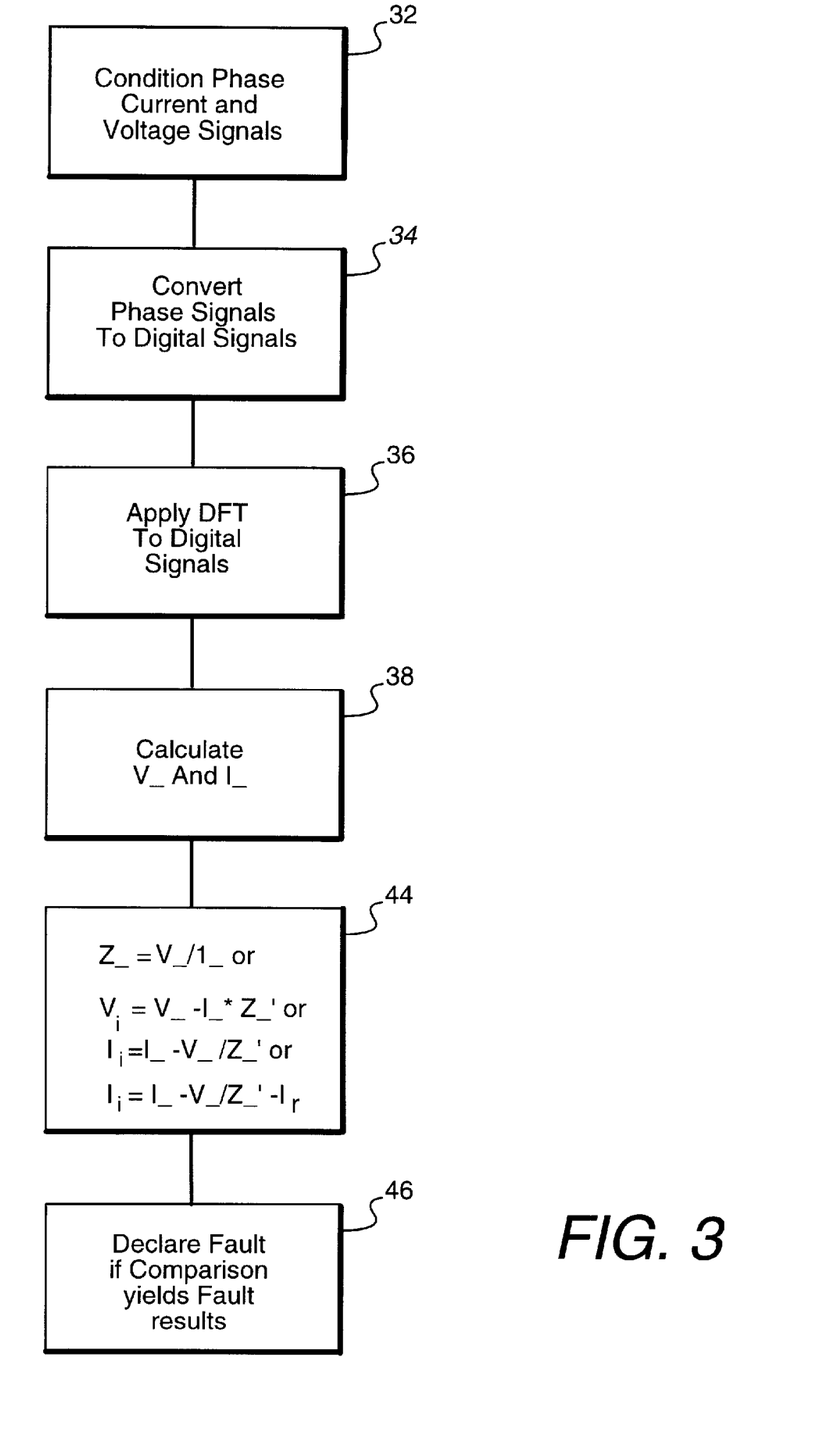
FIG. 3 is a flow chart of a turn fault detector.

FIG. 3 is a flow chart from aforementioned Koegl et al., U.S. Pat. No. 5,514,978 which illustrates a related embodiment of the present invention which is particularly useful when the magnitude of negative sequence voltage on the incoming line is small. The embodiment FIG. 3 is similar to that discussed above (with signal conditioning at step 32, conversion to digital signals at step 34, and application of the DFT at step 36, and calculation of $V_-$ and $I_-$ at step 38) except that the calculations of $V_-$ and $I_-$ are applied to a different calculation at step 44 of FIG. 3 for comparison purposes. A significant effect of a turn fault is the appearance of an extra or injected current in the faulted phase. Because of the possibility of voltage and motor imbalance, the current measurement is interpreted differently by computing $I_- - V_-/Z'_-$ where $I_-$ is the estimated negative sequence current, $V_-$ is the estimated negative sequence voltage, and $Z'_-$ is the approximate characteristic negative sequence impedance of the motor. The characteristic negative sequence impedance varies with load but is typically invariant to turn faults.

There are several techniques for determining $Z'_-$. Motor manufacturers sometimes provide circuit parameters. If the motor parameters are known and if they are reasonably independent of load, then $Z'_-$ can be computed from the parameters. If a circuit parameter list is not available from the manufacturer, the parameters can be measured. One measurement technique is to run the motor under normal conditions, run the motor under locked rotor conditions, and process resulting data to produce the equivalent circuit parameters. An alternate measurement technique is to insert a calibration device 30 such as a resistor or an inductor into one phase between the motor and the respective voltage sensor during a testing sequence. After the calibration device is inserted, current and voltage waveforms are sensed and the negative sequence values are obtained as described above, except that the voltage and current waveforms obtained are waveforms which have been affected by the presence of the calibration device. The calibration device is removed before normal operation of the motor is resumed.

A turn fault is indicated when the magnitude of $I_- - V_-/Z'_-$ exceeds a threshold. If the magnitude is zero, there is no fault. Either a fixed or a variable threshold is possible, depending on whether it is desired to increase sensitivity if the motor is lightly loaded. If a fixed threshold is used, the threshold is selected based on the desired degree of sensitivity, while considering that the lower limit of sensitivity is dictated by residual measurement errors, motor unbalance, and noise. For additional sensitivity, it is possible to vary the threshold in proportion to the magnitude of the positive sequence current ($I_+$), particularly if the major portion of the error in the estimate of negative sequence current is due to a calibration error.

A variation is to monitor the equivalent back voltage in the negative sequence circuit, which is equal to $V_- - I_-^* Z_-$, and to declare a turn fault when the back voltage exceeds a certain threshold.

Aforementioned Premerlani et al, U.S. application Ser. No. 08/617,718 further describes estimating a fault injected negative sequence current ($Ii_-$) according to the following equation:

$$Ii_- = I_- - V_-/Z_- - Ir, \qquad (21)$$

wherein $Ir$ comprises a residual injected negative sequence current. In one embodiment, the step of estimating the residual injected negative sequence current comprises, prior to obtaining the motor current waveforms, determining a function for the residual injected negative sequence current. The step of determining the function for the residual injected negative sequence current can include determining a function dependent upon the positive sequence voltage phasor and the positive sequence current phasor. The step of determining the function for the residual injected negative sequence current can further include obtaining initial motor current and voltage waveforms; converting the initial motor current and voltage waveforms to initial digitized current and voltage waveforms; extracting initial fundamental phasors of the initial digitized current and voltage waveforms; applying a symmetrical component transform to the initial fundamental phasors to obtain initial symmetrical component current and voltage phasors including initial positive sequence voltage phasors, initial positive sequence current phasors, and initial negative sequence current phasors; and estimating a current ratio of each one of the initial negative sequence current phasors to a respective one of the initial positive sequence current phasors.

When detecting turn faults, phasor values are calculated every few cycles. If equations 17 or 19 are used, full inversion of the matrix is performed. A simplifying approximation can be made for a data window that is approximately equal to an integer multiple of the period of the fundamental power system frequency by assuming that the matrix to be inverted will be approximately equal to N/2 times the identity matrix $$\left(\begin{bmatrix} 1 & 0 \\ 0 & 1 \end{bmatrix}\right).$$

For some applications, it is also useful to know how well the raw samples fit a trigonometric function. For example, estimating the uncertainty of a measurement can be useful in calculating a variable threshold for turn fault analysis. The trigonometric function fit can be calculated as follows by expressing the sum of the squares of the errors between the samples and the value of the trigonometric function at the sample angles:

$$\Sigma \epsilon_k \cdot \epsilon_k = \Sigma x(\theta_k) \cdot x(\theta_k) - \hat{X}_c \cdot \Sigma x(\theta_k) \cos \theta_k - \hat{X}_s \cdot \Sigma x(\theta_k) \sin \theta_k, \qquad (22)$$

wherein $\epsilon_k$ represents the error between an estimated phasor (the projected value of the phasor) and the actual power system phasor.

The present invention provides a computationally efficient method for computing the sum of the squares of the errors by reusing quantities of previous equations so that not very much extra computation is needed. The only added computation is the sum of the squares of the raw data samples.

Variance calculations can be used to set thresholds in diagnostic applications such as turn fault detection, for example, for increasing sensitivity of the analysis. The variance of a phase estimate of a fundamental power system frequency voltage or current measurement can be calculated as in equation 13a or 16.

COMPENSATION FOR MISSING DATA ON TRANSMISSION LINES

Figure 4:
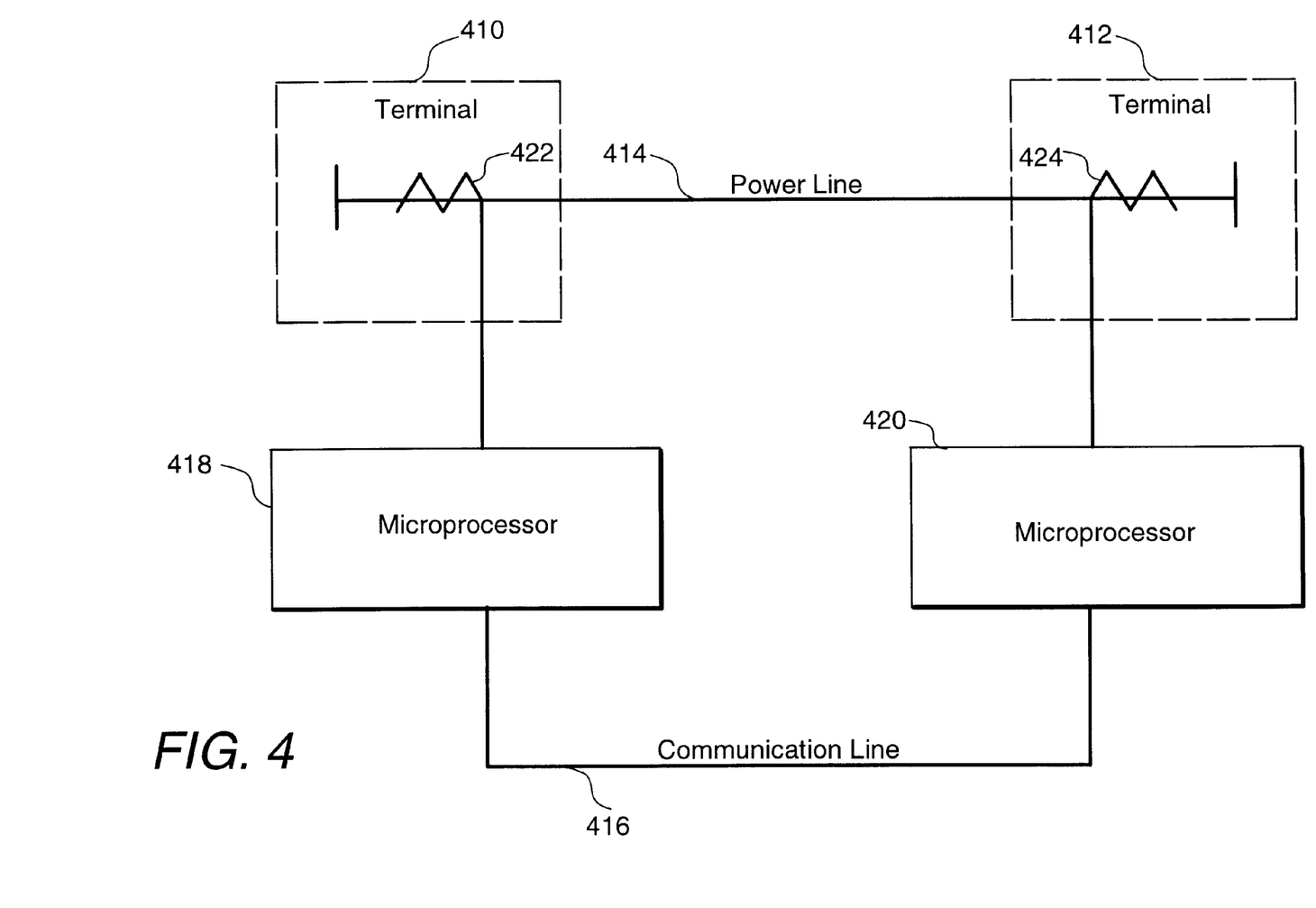
FIG. 4 is a block diagram of a multi-terminal transmission line.

FIG. 4 is a block diagram of a multi-terminal transmission line including two terminals 410 and 412 with a power line 414 and a communication line 416 therebetween. Current sensors 422 and 424 provide current signals to respective microprocessors 418 and 420. The microprocessors are adapted to calculate phasors from signals received from remote terminals.

As described in aforementioned Adamiak et al., U.S. application Ser. No. 08/713,295, a phaselet is a portion of the sine and cosine weighted sum of data samples. Over a half cycle, a phasor is calculated from phaselets by simply adding phaselets and multiplying by 4/N. For window sizes other than a half cycle or multiple of a half cycle, a phasor is calculated by adding phaselets over the window and then multiplying a normalization two-by-two real matrix by the real and imaginary portions of the sum of phaselets. Phasors are represented as real and imaginary components. The real component represents the $\cos(\omega t)$ term, and the imaginary components represent minus the $\sin(\omega t)$ term. The convention used herein is to represent all phasor quantities as peak values. To convert to rms, divide by the square root of two.

In the following equations, all indexes in summations increment by 1 from the lower limit of the summation up to an including the upper limit. Counting of samples, phaselets, and cycles starts from 1, which is assumed to be the time reference t=0. The arguments of the cosine and sine functions are offset by ½ the sampling angle. The first coefficient, for time t=0, integer index (k) count=1, is for a phase angle of ½ the sampling angle. Sampling occurs at the rate of N samples per cycle, where the choice of N depends on the particular application. Phaselets are calculated every P data samples, where the choice of P depends on the application requirements. Phasors are updated whenever new phaselets are available. In the case of a ½ cycle sliding window, a fixed number of phaselets are added to produce a phasor. When a variable window is used, the number of phaselets is proportional to the window size.

A phaselet is a sum of sine and cosine weighted samples over a fraction of a cycle. An appropriate way to extract 16 phasor values per cycle from 64 samples per cycle is to first calculate sine and cosine weighted sums of groups of 4 samples per group. A DFT over a ½ cycle could be calculated by adding phaselets over the ½ cycle and multiplying by a suitable factor. For other size windows, a DFT is calculated by adding phasors and multiplying by an appropriate matrix that depends on the width and phase angle of the window.

Phaselets are calculated as described in Adamiak et al. with the following equations:

$$PhaseletReal_p = \sum_{k=p \cdot P - P + 1}^{p \cdot P} \cos\left(\frac{2 \cdot \pi}{N} \cdot \left(k - \frac{1}{2}\right)\right) \cdot x_k, \quad (23)$$

and $$PhaseletImaginary_p = -\sum_{k=p \cdot P - P + 1}^{p \cdot P} \sin\left(\frac{2 \cdot \pi}{N} \cdot \left(k - \frac{1}{2}\right)\right) \cdot x_k, \quad (24)$$

wherein $PhaseletReal_p$=the real part of the pth phaselet for signal x, $PhaseletImaginary_p$=the imaginary part of the pth phaselet for x, p=phaselet index; there are N/P phaselets per cycle, P=number of samples per phaselet, N=number of samples per cycle, $x_k$=kth sample of signal x, taken at N samples per cycle.

As further described by Adamiak et al., converting phaselets into phasors can also be done for variable window sizes by adding phaselets and then multiplying by a phaselet transformation matrix. First the phaselets are added together over the desired window:

$$PhaseletSumReal_n = \sum_{p=n-\frac{W}{P}+1}^{n} PhaseletReal_p, \quad (25)$$

and $$PhasletSumImaginary_n = \sum_{p=n-\frac{W}{P}+1}^{n} PhaseletImaginary_p, \quad (26)$$

wherein W=window size in samples, and W/P is window size in phaselets.

Optionally, these sums can be calculated recursively. The sums at one value of n can be calculated from the previous sums by adding the newest terms of the new sums and subtracting the oldest terms of the old sums. Sums are then converted into phasors by multiplying by the following matrix:

$$\begin{bmatrix} PhasorReal_n \\ PhasorImaginary_n \end{bmatrix} = \begin{bmatrix} T_{RR}(n, W) & T_{RI}(n, W) \\ T_{IR}(n, W) & T_{II}(n, W) \end{bmatrix} \cdot \begin{bmatrix} PhaseletSumReal_n \\ PhaseletSumImaginary_n \end{bmatrix} \quad (27)$$

wherein $$T_{RR} = \left(1 - \left(\frac{1}{W} \cdot \cos\left(\frac{4 \cdot \pi \cdot P \cdot n}{N} - \frac{2 \cdot \pi \cdot W}{N}\right) \cdot \frac{\sin\left(\frac{2 \cdot \pi \cdot W}{N}\right)}{\sin\left(\frac{2 \cdot \pi}{N}\right)}\right)\right) \cdot \frac{2}{W - \frac{\left(\sin\left(\frac{2 \cdot \pi \cdot W}{N}\right)\right)^2}{W \cdot \left(\sin\left(\frac{2 \cdot \pi}{N}\right)\right)^2}} \quad (28)$$

-continued $$T_{RI} = T_{IR} = \frac{1}{W} \cdot \sin\left(\frac{4\cdot\pi\cdot P\cdot n}{N} - \frac{2\cdot\pi\cdot W}{N}\right) \cdot \quad (29)$$

$$\frac{\sin\left(\frac{2\cdot\pi\cdot W}{N}\right)}{\sin\left(\frac{2\cdot\pi}{N}\right)} \cdot \frac{2}{W - \frac{\left(\sin\left(\frac{2\cdot\pi\cdot W}{N}\right)\right)^2}{W\cdot\left(\sin\left(\frac{2\cdot\pi}{N}\right)\right)^2}}$$

$$T_{II} = \left(1 + \left(\frac{1}{W}\cdot\cos\left(\frac{4\cdot\pi\cdot P\cdot n}{N} - \frac{2\cdot\pi\cdot W}{N}\right)\cdot\frac{\sin\left(\frac{2\cdot\pi\cdot W}{N}\right)}{\sin\left(\frac{2\cdot\pi}{N}\right)}\right)\right) \cdot \quad (30)$$

$$\frac{2}{W - \frac{\left(\sin\left(\frac{2\cdot\pi\cdot W}{N}\right)\right)^2}{W\cdot\left(\sin\left(\frac{2\cdot\pi}{N}\right)\right)^2}}$$

The matrix thus depends on design constants P and N and variables W and n. In principle, a matrix should be calculated for each combination of n and W.

Until a disturbance is detected, phaselets will be combined to form a sliding window DFT. After a disturbance is detected, the window is re-initialized by removing the previously calculated phaselets from the current window and then expanding the current window as new data is gathered to reform a sliding window DFT. In this manner, the more relevant disturbance information is not diluted by the presence of earlier obtained normal information.

As discussed above, in Adamiak et al., occasional failures of the digital channel that result in lost information were addressed by resetting the computation window after data again became available. A slight delay in fault detection can occur in the event that some phaselet data is lost at the beginning of a fault.

The present invention reduces fault detection delay in the event of partial loss of phaselet data by appropriately combining whatever phaselet information is available. The combination can be achieved by treating the phaselet information that is available as variable spaced data. For variable spaced data, phasors can be calculated from raw samples using equation (17).

In another embodiment of the present invention, instead of calculating equation (17) during an operating situation, certain calculations can be performed prior to an operating situation. For example, the following parameters can be precalculated as a function of p for each value of p:

$$ARR_p = \left[\sum_{k=p\cdot P-P+1}^{p\cdot P}\left(\cos\left(\frac{2\cdot\pi}{N}\cdot\left(k-\frac{1}{2}\right)\right)\right)^2\right] \quad (31)$$

$$AII_p = \left[\sum_{k=p\cdot P-P+1}^{p\cdot P}\left(\sin\left(\frac{2\cdot\pi}{N}\cdot\left(k-\frac{1}{2}\right)\right)\right)^2\right] \quad (32)$$

$$ARI_p = \left[\sum_{k=p\cdot P-P+1}^{p\cdot P} -\sin\left(\frac{2\cdot\pi}{N}\cdot\left(k-\frac{1}{2}\right)\right)\cdot\cos\left(\frac{2\cdot\pi}{N}\cdot\left(k-\frac{1}{2}\right)\right)\right] \quad (33)$$

Then phaselet sums can be calculated from phaselets as described above, except that missing phaselets are ignored. To convert the phaselet sums into phasors, the ARR, AII, and ARI parameters that correspond to the available phaselets are first added as follows:

$$ARR_n = \sum_{k=p\cdot P-P+1}^{p\cdot P} ARR_p \quad (34)$$

$$AII_n = \sum_{k=p\cdot P-P+1}^{p\cdot P} AII_p \quad (35)$$

$$ARI_n = \sum_{k=p\cdot P-P+1}^{p\cdot P} ARI_p \quad (36)$$

with ARRp, AIIp, and ARIp set to zero for any value of p for which there is no phaselet information available.

Then the following matrix is formed:

$$\begin{bmatrix} T'_{RR}(n) & T'_{RI}(n) \\ T'_{IR}(n) & T'_{II}(n) \end{bmatrix} = \begin{bmatrix} \dfrac{AII_n}{ARR_n\cdot AII_n - ARI_n^2} & \dfrac{-ARI_n}{ARR_n\cdot AII_n - ARI_n^2} \\ \dfrac{-ARI_n}{ARR_n\cdot AII_n - ARI_n^2} & \dfrac{ARR_n}{ARR_n\cdot AII_n - ARI_n^2} \end{bmatrix}. \quad (37)$$

This matrix is then used in a similar manner as the matrix in equation (27):

$$\begin{bmatrix} PhasorReal_n \\ PhasorImaginary_n \end{bmatrix} = \begin{bmatrix} T'_{RR}(n) & T'_{RI}(n) \\ T'_{IR}(n) & T'_{II}(n) \end{bmatrix} \cdot \quad (38)$$

$$\begin{bmatrix} PhaseletSumReal_n \\ PhaseletSumImaginary_n \end{bmatrix}$$

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for obtaining a power system phasor comprising:
   sampling a power system signal at instants determined by a nominal power system frequency to provide a plurality of data samples;
   using the plurality of data samples to estimate a phasor having an elliptical trajectory;
   generating a deviation formula representing a frequency deviation between an actual power system frequency and the nominal power system frequency; and
   using the deviation formula to perform a coordinate transform of the estimated phasor to provide a scaled phasor having a substantially circular trajectory.

2. The method of claim 1 wherein using the plurality of data samples to estimate the phasor having the elliptical trajectory comprises performing a discrete Fourier transform of the data samples.

3. The method of claim 1 wherein using the deviation formula comprises obtaining at least one correction factor $\epsilon_1$ by the following equation:

$$\varepsilon_1 = \frac{\pi\cdot\left(\dfrac{f_p - f_s}{f_s}\right)}{N\cdot\sin\dfrac{2\pi}{N}}$$

wherein $f_p$ represents the actual power system frequency, $f_s$ represents the nominal power system frequency, and N represents a number of data samples per cycle; and multiplying a real part of the estimated phasor by one (1) minus the correction factor; and multiplying the imaginary part of the estimated phasor by one (1) plus the correction factor.

4. The method of claim 1 wherein using the deviation formula comprises obtaining first and second correction factors $\epsilon_1$ and $\epsilon_2$ by the following equations:

$$\varepsilon_1 = \frac{\pi \cdot \left(\frac{f_p - f_s}{f_s}\right)}{N \cdot \sin\frac{2\pi}{N}}$$

and $$\varepsilon_2 = \frac{\left(\pi \cdot \left(\frac{f_p - f_s}{f_s}\right)\right)^2}{6}$$

wherein $f_p$ represents the actual power system frequency, $f_s$ represents the nominal power system frequency, and N represents a number of data samples per cycle; and multiplying a real part of the estimated phasor by the one (1) minus the first correction factor plus the second correction factor; and multiplying the imaginary part of the estimated phasor by one (1) plus the first correction factor plus the second correction factor.

5. A method for obtaining a power system phasor variance comprising:

sampling a power system signal at instants determined by a nominal power system frequency to provide a plurality of data samples;

using the plurality of data samples to estimate a phasor having an elliptical trajectory;

generating a deviation formula representing a frequency deviation between an actual power system frequency and the nominal power system frequency;

using the deviation formula to perform a coordinate transform of the estimated phasor to provide a scaled phasor having a substantially circular trajectory; and obtaining the power system phasor variance $\sigma_m^2$ by using the following equations:

$$\langle \sigma_m^2 \rangle = \frac{1}{N} \cdot SumOfSquares_m - \frac{1}{2} \cdot ((PhasorReal_m)^2 +$$

$$(PhasorImaginary_m)^2) SumOfSquares_m = \left[\sum_{k=m\cdot N-N+1}^{m\cdot N} x_k^2\right]$$

wherein m represents a sample number, N represents a number of samples per cycle, $PhasorReal_m$ represents a real portion of the scaled phasor, $PhasorImaginary_m$ represents an imaginary portion of the scaled phasor, and $SumOfSquares_m$ represents a sum of the squares of the data samples $x_k$.

6. A method for obtaining a power system phasor variance comprising:

sampling a power system signal at instants determined by a nominal power system frequency to provide a plurality of data samples;

using the plurality of data samples to estimate a phasor having an elliptical trajectory;

generating a deviation formula representing a frequency deviation between an actual power system frequency and the nominal power system frequency;

using the deviation formula to perform a coordinate transform of the estimated phasor to provide a scaled phasor having a substantially circular trajectory;

rotating the scaled phasor; and obtaining the power system phasor variance $\sigma_m^2$ by using the following equations:

$$\langle \sigma_m^2 \rangle =$$

$$\frac{1}{N} \cdot SumOfSquares_m - \frac{1}{2}\left((\text{real}\overline{Z}_m^r)^2 \cdot (1 + 2 \cdot \varepsilon_1) + (\text{imag}\overline{Z}_m^r)^2 \cdot (1 - 2 \cdot \varepsilon_1)\right)$$

$$SumOfSquares_m = \left[\sum_{k=m\cdot N-N+1}^{m\cdot N} x_k^2\right] \text{ and}$$

$$\varepsilon_1 = \frac{\pi \cdot \left(\frac{f_p - f_s}{f_s}\right)}{N \cdot \sin\frac{2\pi}{N}}$$

wherein m represents a sample number, N represents a number of samples per cycle, $\text{real}\overline{Z}_m^r$ represents a real portion of the rotated and scaled phasor, $\text{imag}\overline{Z}_m^r$ represents an imaginary portion of the rotated and scaled phasor, $SumOfSquares_m$ represents a sum of the squares of the data samples $x_k$, and $\epsilon_1$ represents a correction factor.

7. A method for obtaining a power system phasor variance from unevenly spaced data samples comprising:

sampling a power system signal to provide a plurality of unevenly spaced data samples;

minimizing squares of errors between the unevenly spaced data samples and an approximating sinusoidal function of the unevenly spaced data samples; and obtaining the power system phasor variance $\sigma_m^2$ by using the following equations:

$$\langle \sigma_m^2 \rangle =$$

$$\frac{1}{N} \cdot SumOfSquares_m - \frac{1}{2}\left((\text{real}\overline{Z}_m^r)^2 \cdot (1 + 2 \cdot \varepsilon_1) + (\text{imag}\overline{Z}_m^r)^2 \cdot (1 - 2 \cdot \varepsilon_1)\right)$$

$$SumOfSquares_m = \left[\sum_{k=m\cdot N-N+1}^{m\cdot N} x_k^2\right] \text{ and}$$

$$\varepsilon_1 = \frac{\pi \cdot \left(\frac{f_p - f_s}{f_s}\right)}{N \cdot \sin\frac{2\pi}{N}}$$

wherein m represents a sample number, N represents a number of samples per cycle, $\text{real}\overline{Z}_m^r$ represents a cosine trigonometric function of the power system phasor, $\text{imag}\overline{Z}_m^r$ represents a sine trigonometric function of the power system phasor, $SumOfSquares_m$ represents a sum of the squares of the data samples $x_k$, and $\epsilon_1$ represents a correction factor.

8. A method for detecting turn faults comprising:

sampling a power system signal at instants determined by a nominal power system frequency to provide a plurality of voltage and current data samples;

using the plurality of voltage and current data samples to estimate voltage and current phasors having elliptical trajectories;

generating a deviation formula representing a frequency deviation between an actual power system frequency and the nominal power system frequency; and using the deviation formula to perform coordinate transforms of the estimated phasors to provide scaled voltage and current phasors having substantially circular trajectories;

extracting fundamental voltage and current phasors of the scaled voltage and current phasors;

applying a symmetrical component transform to the fundamental voltage and current phasors to obtain symmetrical component voltage and current phasors; and using the symmetrical component voltage and current phasors to determine the existence of a turn fault.

9. The method of claim 8, further including performing trigonometric function fits with the symmetrical component voltage and current phasors as follows:

$$\Sigma\epsilon_k \cdot \epsilon_k = \Sigma x(\theta_k) \cdot x(\theta_k) - \hat{X}_c \cdot \Sigma x(\theta_k) \cos\theta_k - \hat{X}_s \cdot \Sigma x(\theta_k) \cdot \sin\theta_k$$

wherein $\epsilon_k$ represents an error between one of the scaled voltage and current phasors and a respective actual voltage or current phasor, x represents data samples taken at arbitrary angles $\theta_k$, $\hat{X}_c$ represents a cosine trigonometric function of the one of the scaled voltage and current phasors, and $\hat{X}_s$ represents a negative sine trigonometric function of the one of the scaled voltage and current phasors, and wherein using the symmetrical component voltage and current phasors to determine the existence of a turn fault includes using the error.

10. The method of claim 8, further including obtaining a phasor variance $\sigma_m^2$ by using the following equations:

$$\langle \sigma_m^2 \rangle = \frac{1}{N} \cdot SumOfSquares_m - \frac{1}{2} \cdot ((PhasorReal_m)^2 + (PhasorImaginary_m)^2)$$

and $$SumOfSquares_m = \left[ \sum_{k=m \cdot N - N + 1}^{m \cdot N} x_k^2 \right]$$

wherein m represents a sample number, N represents a number of samples per cycle, PhasorReal$_m$ represents a real portion of one of the scaled voltage and current phasors, PhasorImaginary$_m$ represents an imaginary portion of the one of the scaled voltage and current phasors, and SumOfSquares$_m$ represents a sum of the squares of the data samples $x_k$, and wherein using the symmetrical component voltage and current phasors to determine the existence of a turn fault includes using the phasor variance.

11. The method of claim 8, further including rotating the scaled voltage and current phasors and obtaining a phasor variance $\sigma_m^2$ by using the following equations:

$$\langle \sigma_m^2 \rangle = \frac{1}{N} \cdot SumOfSquares_m - \frac{1}{2}\left((\text{real}\overline{Z}_m^r)^2 \cdot (1 + 2 \cdot \varepsilon_1) + (\text{imag}\overline{Z}_m^r)^2 \cdot (1 - 2 \cdot \varepsilon_1)\right)$$

$$SumOfSquares_m = \left[ \sum_{k=m \cdot N - N + 1}^{m \cdot N} x_k^2 \right]$$

and $$\varepsilon_1 = \frac{\pi \cdot \left(\frac{f_p - f_s}{f_s}\right)}{N \cdot \sin\frac{2\pi}{N}}$$

wherein m represents a sample number, N represents a number of samples per cycle, real$\overline{Z}_m^r$ represents a real portion of one of the rotated and scaled voltage and current phasors, imag$\overline{Z}_m^r$ an imaginary portion of the one of the rotated and scaled voltage and current phasors, SumOfSquares$_m$ represents a sum of the squares of the data samples $x_k$, and $\epsilon_1$ represents a correction factor, and wherein using the symmetrical component voltage and current phasors to determine the existence of a turn fault includes using the phasor variance.

12. A method for detecting turn faults comprising:

sampling a power system signal to provide a plurality of unevenly spaced voltage and current data samples;

obtaining scaled voltage and current data phasors by minimizing squares of errors between the voltage and current data samples and respective approximating sinusoidal functions of the voltage and current data samples;

extracting fundamental voltage and current phasors of the scaled voltage and current phasors;

applying a symmetrical component transform to the fundamental voltage and current phasors to obtain symmetrical component voltage and current phasors;

rotating one of the scaled current and voltage phasors and obtaining a phasor variance $\sigma_m^2$ by using the following equations:

$$\langle \sigma_m^2 \rangle = \frac{1}{N} \cdot SumOfSquares_m - \frac{1}{2}\left((\text{real}\overline{Z}_m^r)^2 \cdot (1 + 2 \cdot \varepsilon_1) + (\text{imag}\overline{Z}_m^r)^2 \cdot (1 - 2 \cdot \varepsilon_1)\right)$$

$$SumOfSquares_m = \left[ \sum_{k=m \cdot N - N + 1}^{m \cdot N} x_k^2 \right]$$

and $$\varepsilon_1 = \frac{\pi \cdot \left(\frac{f_p - f_s}{f_s}\right)}{N \cdot \sin\frac{2\pi}{N}}$$

wherein m represents a sample number, N represents a number of samples per cycle, real$\overline{Z}_m^r$ represents a cosine trigonometric function of the one of the rotated and scaled voltage and current phasors, imag$\overline{Z}_m^r$ represents a sine trigonometric function of the one of the rotated and scaled voltage and current phasors, SumOfSquares$_m$ represents a sum of the squares of the data samples $x_k$, and $\epsilon_1$ represents a correction factor; and using the symmetrical component voltage and current phasors and the phasor variance to determine the existence of a turn fault.

13. A method for computing phasors over a window having missing data, the method including:

measuring phase current samples;

calculating real and imaginary phaselets comprising partial sums of the phase current samples;

calculating sums of the real and imaginary phaselets over the sample window;

calculating a phase transformation matrix as follows:

$$\begin{bmatrix} T'_{RR}(n) & T'_{RI}(n) \\ T'_{IR}(n) & T'_{II}(n) \end{bmatrix} = \begin{bmatrix} \dfrac{AII_n}{ARR_n \cdot AII_n - ARI_n^2} & \dfrac{-ARI_n}{ARR_n \cdot AII_n - ARI_n^2} \\ \dfrac{-ARI_n}{ARR_n \cdot AII_n - ARI_n^2} & \dfrac{ARR_n}{ARR_n \cdot AII_n - ARI_n^2} \end{bmatrix}$$

wherein $$ARR_n = \sum_{k=p\cdot P-P+1}^{p\cdot P} ARR_p$$

$$AII_n = \sum_{k=p\cdot P-P+1}^{p\cdot P} AII_p$$

$$ARI_n = \sum_{k=p\cdot P-P+1}^{p\cdot P} ARI_p$$

$$ARR_p = \left[ \sum_{k=p\cdot P-P+1}^{p\cdot P} \left( \cos\left(\frac{2\cdot\pi}{N}\cdot\left(k-\frac{1}{2}\right)\right)\right)^2 \right]$$

$$AII_p = \left[ \sum_{k=p\cdot P-P+1}^{p\cdot P} \left( \sin\left(\frac{2\cdot\pi}{N}\cdot\left(k-\frac{1}{2}\right)\right)\right)^2 \right]$$

$$ARR_p = \left[ \sum_{k=p\cdot P-P+1}^{p\cdot P} -\sin\left(\frac{2\cdot\pi}{N}\cdot\left(k-\frac{1}{2}\right)\right)\cdot\cos\left(\frac{2\cdot\pi}{N}\cdot\left(k-\frac{1}{2}\right)\right) \right]$$

and wherein p represents the phaselet index, n represents a sample number, k represents a summation integer, N represents a number of samples per cycle, and P represents a number of samples per phaselet; and calculating real and imaginary phasor components over the sample window by multiplying the sums of the real and imaginary phaselets by the phaselet transformation matrix.

14. A method of consolidating phase current samples for transmission from one location to another location, the method including:

at the one location,
  obtaining the phase current samples, and
  calculating real and imaginary phaselets comprising partial sums of the phase current samples;

transmitting the real and imaginary phaselets from the one location to the another location; and at the another location,
  calculating sums of the real and imaginary phaselets over a sample window, and
  calculating real and imaginary phasor components over the sample window by multiplying the sums of the real and imaginary phaselets by a phaselet transformation matrix, wherein the phaselet transformation matrix comprises:

$$\begin{bmatrix} T'_{RR}(n) & T'_{RI}(n) \\ T'_{IR}(n) & T'_{II}(n) \end{bmatrix}$$

wherein

-continued $$\begin{bmatrix} T'_{RR}(n) & T'_{RI}(n) \\ T'_{IR}(n) & T'_{II}(n) \end{bmatrix} = \begin{bmatrix} \dfrac{AII_n}{ARR_n \cdot AII_n - ARI_n^2} & \dfrac{-ARI_n}{ARR_n \cdot AII_n - ARI_n^2} \\ \dfrac{-ARI_n}{ARR_n \cdot AII_n - ARI_n^2} & \dfrac{ARR_n}{ARR_n \cdot AII_n - ARI_n^2} \end{bmatrix}$$

$$ARR_n = \sum_{k=p\cdot P-P+1}^{p\cdot P} ARR_p$$

$$AII_n = \sum_{k=p\cdot P-P+1}^{p\cdot P} AII_p$$

$$ARI_n = \sum_{k=p\cdot P-P+1}^{p\cdot P} ARI_p$$

$$ARR_p = \left[ \sum_{k=p\cdot P-P+1}^{p\cdot P} \left( \cos\left(\frac{2\cdot\pi}{N}\cdot\left(k-\frac{1}{2}\right)\right)\right)^2 \right]$$

$$AII_p = \left[ \sum_{k=p\cdot P-P+1}^{p\cdot P} \left( \sin\left(\frac{2\cdot\pi}{N}\cdot\left(k-\frac{1}{2}\right)\right)\right)^2 \right]$$

$$ARR_p = \left[ \sum_{k=p\cdot P-P+1}^{p\cdot P} -\sin\left(\frac{2\cdot\pi}{N}\cdot\left(k-\frac{1}{2}\right)\right)\cdot\cos\left(\frac{2\cdot\pi}{N}\cdot\left(k-\frac{1}{2}\right)\right) \right]$$

and wherein p represents the phaselet index, n represents a sample number, k represents a summation integer, N represents a number of samples per cycle, and P represents a number of samples per phaselet.

15. A system for obtaining a power system phasor comprising:

a sampler for sampling a power system signal at instants determined by a nominal power system frequency to provide a plurality of data samples; and a computer for using the plurality of data samples to estimate a phasor having an elliptical trajectory, generating a deviation formula representing a frequency deviation between an actual power system frequency and the nominal power system frequency, and using the deviation formula to perform a coordinate transform of the estimated phasor to provide a scaled phasor having a substantially circular trajectory.

16. A system for obtaining a power system phasor variance comprising:

a sampler for sampling a power system signal at instants determined by a nominal power system frequency to provide a plurality of data samples; and a computer for
  using the plurality of data samples to estimate a phasor having an elliptical trajectory,
  generating a deviation formula representing a frequency deviation between an actual power system frequency and the nominal power system frequency,
  using the deviation formula to perform a coordinate transform of the estimated phasor to provide a scaled phasor having a substantially circular trajectory, and
  obtaining the power system phasor variance $\sigma_m^2$ by using the following equations:

$$\langle \sigma_m^2 \rangle = \frac{1}{N} \cdot SumOfSquares_m -$$
$$\frac{1}{2} \cdot ((PhasorReal_m)^2 + (PhasorImaginary_m)^2)$$

and $\quad SumOfSquares_m = \left[ \sum_{k=m \cdot N - N + 1}^{m \cdot N} x_k^2 \right]$ wherein m represents a sample number, N represents a number of samples per cycle, $PhasorReal_m$ represents a real portion of the scaled phasor, $PhasorImaginary_m$ represents an imaginary portion of the scaled phasor, and $SumOfSquares_m$ represents a sum of the squares of the data samples $x_k$.

17. A system for obtaining a power system phasor variance comprising:

a sampler for sampling a power system signal at instants determined by a nominal power system frequency to provide a plurality of data samples; and a computer for
using the plurality of data samples to estimate a phasor having an elliptical trajectory,
generating a deviation formula representing a frequency deviation between an actual power system frequency and the nominal power system frequency,
using the deviation formula to perform a coordinate transform of the estimated phasor to provide a scaled phasor having a substantially circular trajectory,
rotating the scaled phasor, and
obtaining the power system phasor variance $\sigma_m^2$ by using the following equations:

$$\langle \sigma_m^2 \rangle = \frac{1}{N} \cdot SumOfSquares_m -$$
$$\frac{1}{2} \left( (\text{real}\overline{Z}_m^r)^2 \cdot (1 + 2 \cdot \varepsilon_1) + (\text{imag}\overline{Z}_m^r)^2 \cdot (1 - 2 \cdot \varepsilon_1) \right)$$

$$SumOfSquares_m = \left[ \sum_{k=m \cdot N - N + 1}^{m \cdot N} x_k^2 \right]$$

and $$\varepsilon_1 = \frac{\pi \cdot \left( \frac{f_p - f_s}{f_s} \right)}{N \cdot \sin \frac{2\pi}{N}}$$

wherein m represents a sample number, N represents a number of samples per cycle, $\text{real}\overline{Z}_m^r$ represents a real portion of the rotated and scaled phasor, $\text{imag}\overline{Z}_m^r$ represents an imaginary portion of the rotated and scaled phasor, $SumOfSquares_m$ represents a sum of the squares of the data samples $x_k$, and $\varepsilon_1$ represents a correction factor.

18. A system for obtaining a power system phasor variance from unevenly spaced data samples comprising:

a sampler for sampling a power system signal to provide a plurality of unevenly spaced data samples; and a computer for
minimizing squares of errors between the unevenly spaced data samples and an approximating sinusoidal function of the unevenly spaced data samples; and
obtaining the power system phasor variance $\sigma_m^2$ by using the following equations:

$$\langle \sigma_m^2 \rangle = \frac{1}{N} \cdot SumOfSquares_m -$$
$$\frac{1}{2} \left( (\text{real}\overline{Z}_m^r)^2 \cdot (1 + 2 \cdot \varepsilon_1) + (\text{imag}\overline{Z}_m^r)^2 \cdot (1 - 2 \cdot \varepsilon_1) \right)$$

$$SumOfSquares_m = \left[ \sum_{k=m \cdot N - N + 1}^{m \cdot N} x_k^2 \right]$$

and $$\varepsilon_1 = \frac{\pi \cdot \left( \frac{f_p - f_s}{f_s} \right)}{N \cdot \sin \frac{2\pi}{N}}$$

wherein m represents a sample number, N represents a number of samples per cycle, $\text{real}\overline{Z}_m^r$ represents a cosine trigonometric function of the power system phasor, $\text{imag}\overline{Z}_m^r$ represents a sine trigonometric function of the power system phasor, $SumOfSquares_m$ represents a sum of the squares of the data samples $x_k$, and $\varepsilon_1$ represents a correction factor.

19. A turn fault detection system comprising:

a sampler for sampling a power system signal at instants determined by a nominal power system frequency to provide a plurality of voltage and current data samples; and a computer for
using the plurality of voltage and current data samples to estimate voltage and current phasors having elliptical trajectories,
generating a deviation formula representing a frequency deviation between an actual power system frequency and the nominal power system frequency,
using the deviation formula to perform coordinate transforms of the estimated phasors to provide scaled voltage and current phasors having substantially circular trajectories,
extracting fundamental voltage and current phasors of the scaled voltage and current phasors,
applying a symmetrical component transform to the fundamental voltage and current phasors to obtain symmetrical component voltage and current phasors, and
using the symmetrical component voltage and current phasors to determine the existence of a turn fault.

20. The turn fault detection system of claim 19, wherein the computer is adapted to perform trigonometric function fits with the symmetrical component voltage and current phasors as follows:

$$\Sigma \epsilon_k \cdot \epsilon_k = \Sigma x(\theta_k) \cdot x(\theta_k) - \hat{X}_c \cdot \Sigma x(\theta_k) \cos \theta_k - \hat{X}_s \cdot \Sigma x(\theta_k) \cdot \sin \theta_k$$

wherein $\epsilon_k$ represents an error between one of the scaled voltage and current phasors and a respective actual voltage or current phasor, x represents data samples taken at arbitrary angles $\theta_k$, $\hat{X}_c$ represents a cosine trigonometric function of the one of the scaled voltage and current phasors, and $\hat{X}_s$ represents a negative sine trigonometric function of the one of the scaled voltage and current phasors, and wherein the computer is adapted to use the symmetrical component voltage and current phasors to determine the existence of a turn fault by using the error.

21. The turn fault detection system of claim 19, wherein the computer is adapted to obtain a phasor variance $\sigma_m^2$ by using the following equations:

$$\langle \sigma_m^2 \rangle = \frac{1}{N} \cdot SumOfSquares_m - \frac{1}{2} \cdot ((PhasorReal_m)^2 + (PhasorImaginary_m)^2)$$

$$\text{and} \quad SumOfSquares_m = \left[ \sum_{k=m \cdot N - N + 1}^{m \cdot N} x_k^2 \right]$$

wherein m represents a sample number, N represents a number of samples per cycle, $PhasorReal_m$ represents a real portion of one of the scaled voltage and current phasors, $PhasorImaginary_m$ represents an imaginary portion of the one of the scaled voltage and current phasors, and $SumOfSquares_m$ represents a sum of the squares of the data samples $x_k$, and wherein the computer is adapted to use the phasor variance using with the symmetrical component voltage and current phasors to determine the existence of a turn fault.

22. A system for computing phasors over a window having missing data, the method including:
a sampler for measuring phase current samples; and
a computer for
calculating real and imaginary phaselets comprising partial sums of the phase current samples,
calculating sums of the real and imaginary phaselets over the sample window,
calculating a phase transformation matrix as follows:

$$\begin{bmatrix} T'_{RR}(n) & T'_{RI}(n) \\ T'_{IR}(n) & T'_{II}(n) \end{bmatrix} = \begin{bmatrix} \dfrac{AII_n}{ARR_n \cdot AII_n - ARI_n^2} & \dfrac{-ARI_n}{ARR_n \cdot AII_n - ARI_n^2} \\ \dfrac{-ARI_n}{ARR_n \cdot AII_n - ARI_n^2} & \dfrac{ARR_n}{ARR_n \cdot AII_n - ARI_n^2} \end{bmatrix}$$

wherein $$ARR_n = \sum_{k=p \cdot P - P + 1}^{p \cdot P} ARR_p$$

$$AII_n = \sum_{k=p \cdot P - P + 1}^{p \cdot P} AII_p$$

$$ARI_n = \sum_{k=p \cdot P - P + 1}^{p \cdot P} ARI_p$$

$$ARR_p = \left[ \sum_{k=p \cdot P - P + 1}^{p \cdot P} \left( \cos\left( \frac{2 \cdot \pi}{N} \cdot \left( k - \frac{1}{2} \right) \right) \right)^2 \right]$$

$$AII_p = \left[ \sum_{k=p \cdot P - P + 1}^{p \cdot P} \left( \sin\left( \frac{2 \cdot \pi}{N} \cdot \left( k - \frac{1}{2} \right) \right) \right)^2 \right]$$

$$ARR_p = \left[ \sum_{k=p \cdot P - P + 1}^{p \cdot P} -\sin\left( \frac{2 \cdot \pi}{N} \cdot \left( k - \frac{1}{2} \right) \right) \cdot \cos\left( \frac{2 \cdot \pi}{N} \cdot \left( k - \frac{1}{2} \right) \right) \right]$$

and wherein p represents the phaselet index, n represents a sample number, k represents a summation integer, N represents a number of samples per cycle, and P represents a number of samples per phaselet, and calculating real and imaginary phasor components over the sample window by multiplying the sums of the real and imaginary phaselets by the phaselet transformation matrix.

23. A system of consolidating phase current samples for transmission from one location to another location, the method including:
at the one location,
a sampler for obtaining the phase current samples, and
a computer for calculating real and imaginary phaselets comprising partial sums of the phase current samples;
a transmission line transmitting the real and imaginary phaselets from the one location to the another location; and
at the another location, a computer for
calculating sums of the real and imaginary phaselets over a sample window, and
calculating real and imaginary phasor components over the sample window by multiplying the sums of the real and imaginary phaselets by a phaselet transformation matrix,
wherein the phaselet transformation matrix comprises:

$$\begin{bmatrix} T'_{RR}(n) & T'_{RI}(n) \\ T'_{IR}(n) & T'_{II}(n) \end{bmatrix}$$

wherein $$\begin{bmatrix} T'_{RR}(n) & T'_{RI}(n) \\ T'_{IR}(n) & T'_{II}(n) \end{bmatrix} = \begin{bmatrix} \dfrac{AII_n}{ARR_n \cdot AII_n - ARI_n^2} & \dfrac{-ARI_n}{ARR_n \cdot AII_n - ARI_n^2} \\ \dfrac{-ARI_n}{ARR_n \cdot AII_n - ARI_n^2} & \dfrac{ARR_n}{ARR_n \cdot AII_n - ARI_n^2} \end{bmatrix}$$

$$ARR_n = \sum_{k=p \cdot P - P + 1}^{p \cdot P} ARR_p$$

$$AII_n = \sum_{k=p \cdot P - P + 1}^{p \cdot P} AII_p$$

$$ARI_n = \sum_{k=p \cdot P - P + 1}^{p \cdot P} ARI_p$$

$$ARR_p = \left[ \sum_{k=p \cdot P - P + 1}^{p \cdot P} \left( \cos\left( \frac{2 \cdot \pi}{N} \cdot \left( k - \frac{1}{2} \right) \right) \right)^2 \right]$$

$$AII_p = \left[ \sum_{k=p \cdot P - P + 1}^{p \cdot P} \left( \sin\left( \frac{2 \cdot \pi}{N} \cdot \left( k - \frac{1}{2} \right) \right) \right)^2 \right]$$

$$ARR_p = \left[ \sum_{k=p \cdot P - P + 1}^{p \cdot P} -\sin\left( \frac{2 \cdot \pi}{N} \cdot \left( k - \frac{1}{2} \right) \right) \cdot \cos\left( \frac{2 \cdot \pi}{N} \cdot \left( k - \frac{1}{2} \right) \right) \right]$$

and wherein p represents the phaselet index, n represents a sample number, k represents a summation integer, N represents a number of samples per cycle, and P represents a number of samples per phaselet.

* * * * *